(12) United States Patent
Rogers et al.

(10) Patent No.: US 11,569,814 B1
(45) Date of Patent: Jan. 31, 2023

(54) VARIABLE CAPACITANCE CIRCUIT FOR PHASE LOCKED LOOPS

(71) Applicant: Analog Bits, Inc., Sunnyvale, CA (US)

(72) Inventors: Alan C. Rogers, Palo Alto, CA (US); Raghunand Bhagwan Iyengar, Sunnyvale, CA (US)

(73) Assignee: Analog Bits, Inc., Sunnyvale, GA (US)

( * ) Notice: Subject to any disclaimer, the term of this patent is extended or adjusted under 35 U.S.C. 154(b) by 0 days.

(21) Appl. No.: 17/503,073

(22) Filed: Oct. 15, 2021

(51) Int. Cl.
```
H03B 5/00      (2006.01)
H03B 5/12      (2006.01)
H03L 7/00      (2006.01)
H03K 17/687    (2006.01)
H03L 7/08      (2006.01)
```

(52) U.S. Cl.
CPC ............. *H03K 17/687* (2013.01); *H03L 7/08* (2013.01)

(58) Field of Classification Search
None
See application file for complete search history.

(56) References Cited

U.S. PATENT DOCUMENTS

| | | | | |
|---|---|---|---|---|
| 6,621,365 B1 * | 9/2003 | Hallivuori | ............... | H03J 5/244 331/181 |
| 6,774,736 B1 * | 8/2004 | Kwek | ................... | H03L 7/1974 331/177 V |
| 6,833,769 B2 * | 12/2004 | Seppinen | ............. | H03B 5/1293 331/177 V |
| 7,170,356 B2 * | 1/2007 | Korner | ................. | H03B 5/1228 331/177 V |
| 7,183,870 B2 * | 2/2007 | Takagi | ................. | H03B 5/1231 331/177 V |
| 8,044,741 B2 * | 10/2011 | Barton | ................. | H03L 7/0991 331/177 V |
| 8,154,351 B2 * | 4/2012 | Tadjpour | ................. | H03L 7/104 331/25 |
| 8,248,157 B2 * | 8/2012 | Thaller | ................ | H03B 5/1253 327/586 |
| 8,253,506 B2 * | 8/2012 | Liu | ......................... | H03L 7/104 331/177 V |
| 8,400,226 B2 * | 3/2013 | Chen | .................... | H03B 5/1243 331/185 |
| 8,803,616 B2 * | 8/2014 | Zhang | ..................... | H03L 7/104 331/177 V |
| 2006/0255865 A1 * | 11/2006 | Li | ............................. | H03J 3/20 331/36 C |
| 2007/0146082 A1 * | 6/2007 | Ohara | ..................... | H03L 7/099 331/16 |

(Continued)

*Primary Examiner* — Kenneth B Wells
(74) *Attorney, Agent, or Firm* — Russell Krajec; Krajec Patent Offices, LLC

(57) ABSTRACT

A variable capacitance circuit may operate a Metal Oxide Semiconductor (MOS) transistor or other semiconductor device to switch a capacitor in and out. Several circuits may be combined in a parallel network having offset bias voltages, such that the combined network may produce a variable capacitance over a large voltage range. The variable capacitance circuit may be incorporated into a phase locked loop (PLL) circuit where similar devices may be configured to produce a voltage reference as part of the PLL circuitry. Such a circuit may be immune to temperature, process, or voltage variances, since the current pulse magnitude times the low pass filter resistance times the sensitivity of a controlled voltage oscillator can be held constant.

26 Claims, 10 Drawing Sheets

(56) References Cited

U.S. PATENT DOCUMENTS

2007/0247237 A1\* 10/2007 Mohammadi ........ H03B 5/1228
 331/36 C
2008/0012654 A1\* 1/2008 Han ..................... H03B 5/1253
 331/177 V
2008/0272851 A1\* 11/2008 Lin ...................... H03B 5/1228
 331/177 R \* cited by examiner

800
PHASE LOCKED LOOP
CIRCUIT WITHOUT
BANDGAP CIRCUIT

VARIABLE CAPACITANCE CIRCUIT FOR PHASE LOCKED LOOPS

BACKGROUND

Many uses for variable capacitance components exist in electronics, from phase locked loops to many other uses. Variable capacitance components, such as varactors, variacap, varicap diodes, varactor diode, variable capacitance diodes, variable reactance diodes, or tuning diodes have been developed. Such devices are often known as voltage-controlled capacitors.

Many of the existing components suffer from high costs, manufacturing variability, limited operating bandwidth, or other limitations.

One use case for these variable capacitance components are in phase locked loops. Phase locked loops are used in a wide variety of electronics applications. Some designers have developed "digital" phase locked loop circuits that switch in and out different fixed-value capacitors in order to adjust capacitance within a phase locked loop circuit. Such "digital" phase locked loop solutions comprise a large number of individual components, which can add to design time, surface area, and other costs. Further, such systems are often less accurate or contribute to extra noise because they are not able to smoothly adjust capacitance within the phase locked loop circuit.

SUMMARY

A variable capacitance circuit may operate a Metal Oxide Semiconductor (MOS) transistor or other semiconductor device to switch a capacitor in and out. Several circuits may be combined in a parallel network having offset bias voltages, such that the combined network may produce a variable capacitance over a large voltage range. The variable capacitance circuit may be incorporated into a phase locked loop (PLL) circuit where similar devices may be configured to produce a voltage reference as part of the PLL circuitry. Such a circuit may be immune to temperature, process, or voltage variances, since the charge pump current pulse magnitude times the low pass filter resistance times the sensitivity of a controlled voltage oscillator can be held constant.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DESCRIPTION

Voltage Controlled Oscillator Circuits

Figure 1:
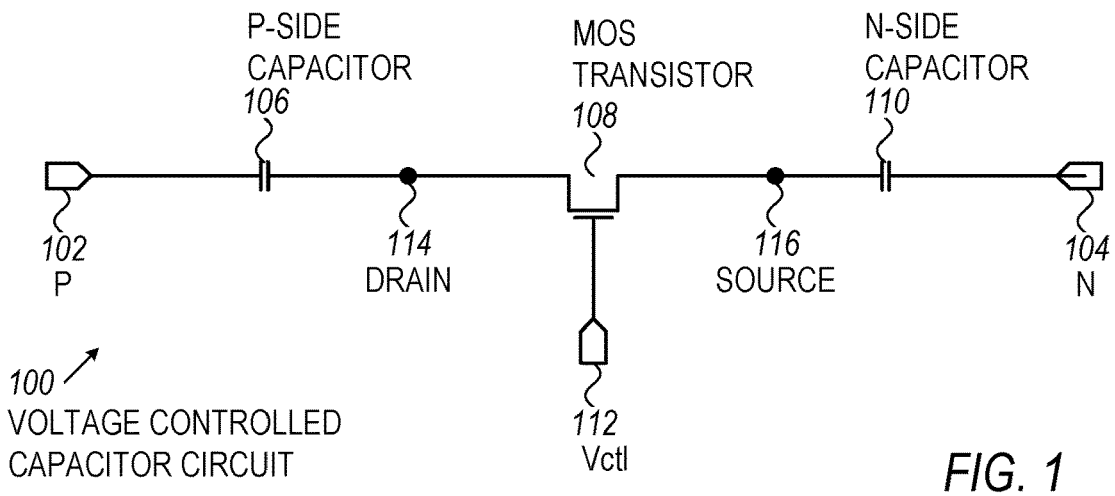
FIG. 1 is a schematic illustration of an embodiment showing a voltage controlled capacitor circuit.

Resonant frequency oscillators typically include a resonator with an amplifier to counteract or replenish the losses which are present in any resonator. The resonant frequency oscillator produces a clock signal at the resonant frequency.

A resonator may have an inductor value of L and a capacitor value of C connected in parallel. The resonant frequency may be given by:

$$f = 1/2\pi\sqrt{LC}$$

In order to vary the frequency of an oscillator, a variable capacitor may be controlled by voltage to form a voltage controlled oscillator. For a range of voltages Vmin to Vmax, the frequency may vary from fmin to fmax. The slope of $\Delta f/\Delta V$ may be the sensitivity of the voltage controlled capacitor.

A voltage controlled capacitor may be constructed from a voltage controlled conductor, such as Metal Oxide Semiconductor (MOS) field-effect transistor devices. The voltage controlled conductor may switch in and out a capacitor in response to an input voltage. Such a circuit may perform a similar function as a conventional varactor, but may be manufactured using conventional transistor devices which are available on virtually all semiconductor processes.

The varactor circuits may be designed to have a wide range of capacitance by configuring the circuits in parallel and supplying different bias voltages for each leg. Such a configuration may expand the effective capacitance to as wide a range as desired.

Phase Locked Loop Circuits Using a Varactor Circuit

The voltage controlled capacitor may be part of a phase locked loop (PLL) circuit. Such a circuit may be constructed with conventional MOS processes, such as transistors, resistors, capacitors, and inductors, and may not require other, more complex devices, such as MOS-based varactors.

As will be discussed later, such a phase locked loop circuit may be much less sensitive to process, voltage, and temperature than other designs, especially designs that incorporate MOS-based varactors.

Because the phase locked loop circuit uses conventional components that may be common to virtually all semiconductor fabrication processes, the design may be portable across processes. Portability across processes may be an enormous advantage to a chip designer, as a standard circuit design may be manufactured on any semiconductor fabrication scenario with minimal tweaking or changes.

By using standard MOS devices, especially for the metal-metal capacitors, any process variability of the capacitors may occur relatively equally on all the capacitors of a silicon chip. Such variability causes all the capacitors to vary up or down in unison. Such a situation is much more desirous than when several different components, for example MOS varactors, might vary in one direction while other components vary in a different direction. In such a case, the tolerance band of the overall circuit is multiplied by a variation of each different component. Such cases have circuits that may be far more sensitive to process, voltage, or temperature variation than circuits where many of the components are of similar or identical construction.

Phase locked loop circuits may use voltage controlled capacitor circuits from conventional MOS components, and may also use the same components in the control voltage circuitry. Because all of the components such as resistors and capacitors in the circuit may vary up or down with process variations, but they vary in unison with each other, the process variations within the phase locked loop circuit may be washed out.

Such a phase locked loop circuit may have similar (or better) performance across manufacturing process variations while keeping the complexity and component count to a minimum. Specifically, sensitive and complex circuits such as bandgap circuits may be eliminated from phase locked loop circuits while keeping the same performance characteristics.

Voltage Controlled Capacitor

FIG. 1 is a schematic diagram showing an embodiment 100 of a voltage controlled capacitor circuit. The voltage controlled capacitor circuit may be part of a voltage controlled oscillator circuit. Embodiment 100 is a circuit showing connections P 102 and N 104, having a P-side capacitor 106, a MOS transistor 108, and an N-side capacitor 110 connected in series. A Vct1 112 signal is attached to the gate of the transistor 108, thereby controlling the capacitance across nodes P 102 and N 104, as seen by an oscillator.

Embodiment 100 may act as a variable capacitor when input P 102 and output N 104 are sine wave or other periodic waveforms.

Resistance between the drain 114 and source 116 may be represented by Rds. Rds may be high when Vct1 112 is below the threshold voltage of the device, and Rds may be low when Vct1 112 is above the threshold voltage of the device.

The capacitance across nodes P 102 and N 104 may be represented by Cpn. As Vct1 112 moves higher, the effective Cpn moves higher as well.

Figure 2:
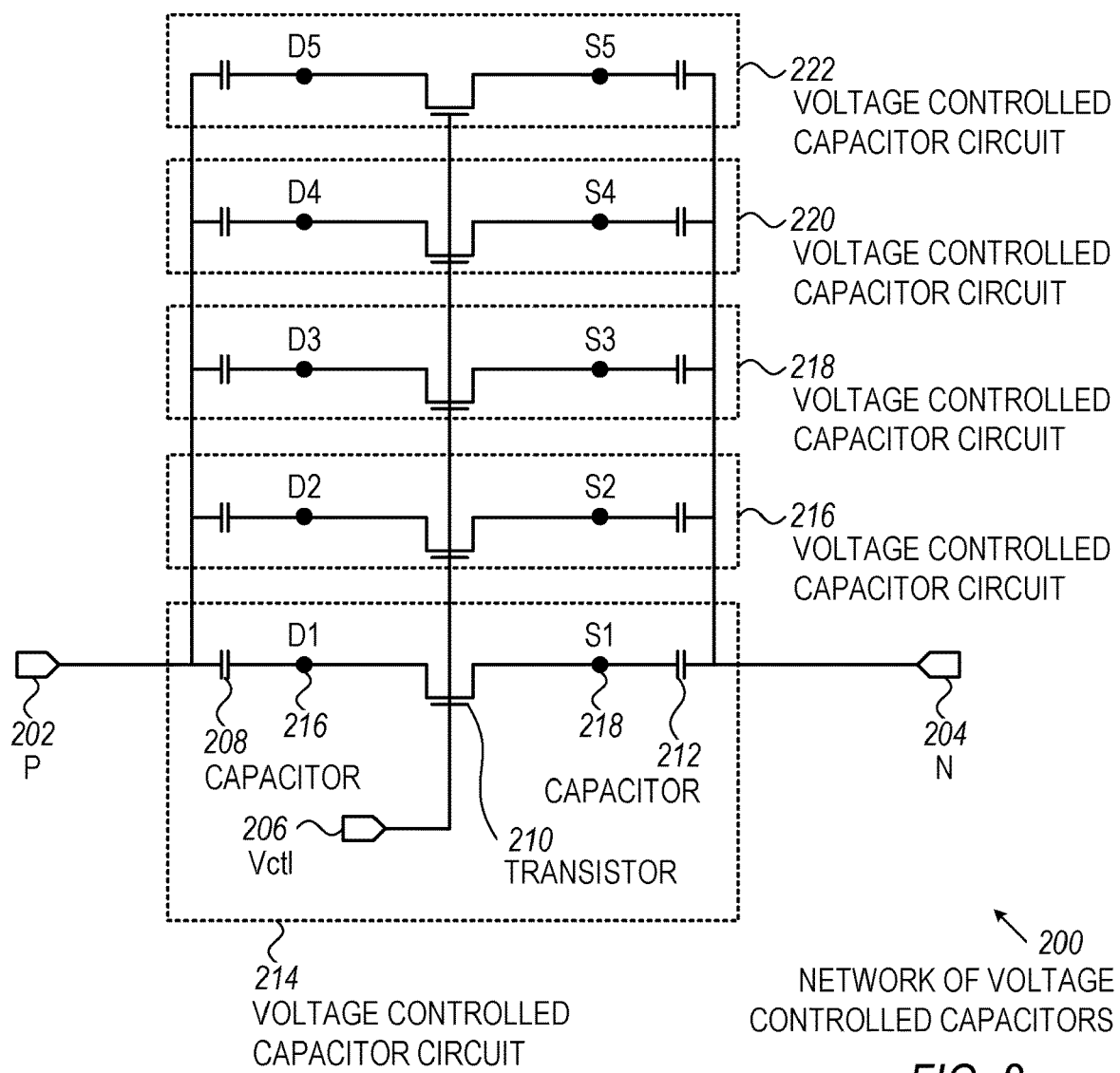
FIG. 2 is a schematic illustration of an embodiment showing a network of voltage controlled capacitor circuits.

FIG. 2 is a schematic diagram showing an embodiment 200 of a network of voltage controlled capacitor circuits. Embodiment 200 is a network of circuits similar to embodiment 100 showing a voltage controlled capacitor circuit, where the voltage controlled capacitor circuits may be connected in parallel and operated on a common Vct1 206 signal.

Nodes P 202 and N 204 are the input and output nodes, respectively, of the circuit. Node P 202 is connected to a capacitor 208, a transistor 210, and a second capacitor 212, which is connected in series to node N 204. The drain D 216 and source S 218 for the transistor 201 are illustrated. This section is one voltage controlled capacitor 214, similar to the embodiment of the voltage controlled capacitor of embodiment 100.

Connected in parallel are voltage controlled capacitor circuits 216, 218, 220, and 222. All of the voltage controlled capacitor circuits have a common Vct1 206, as well as common nodes P 202 and N 204.

Figure 3:
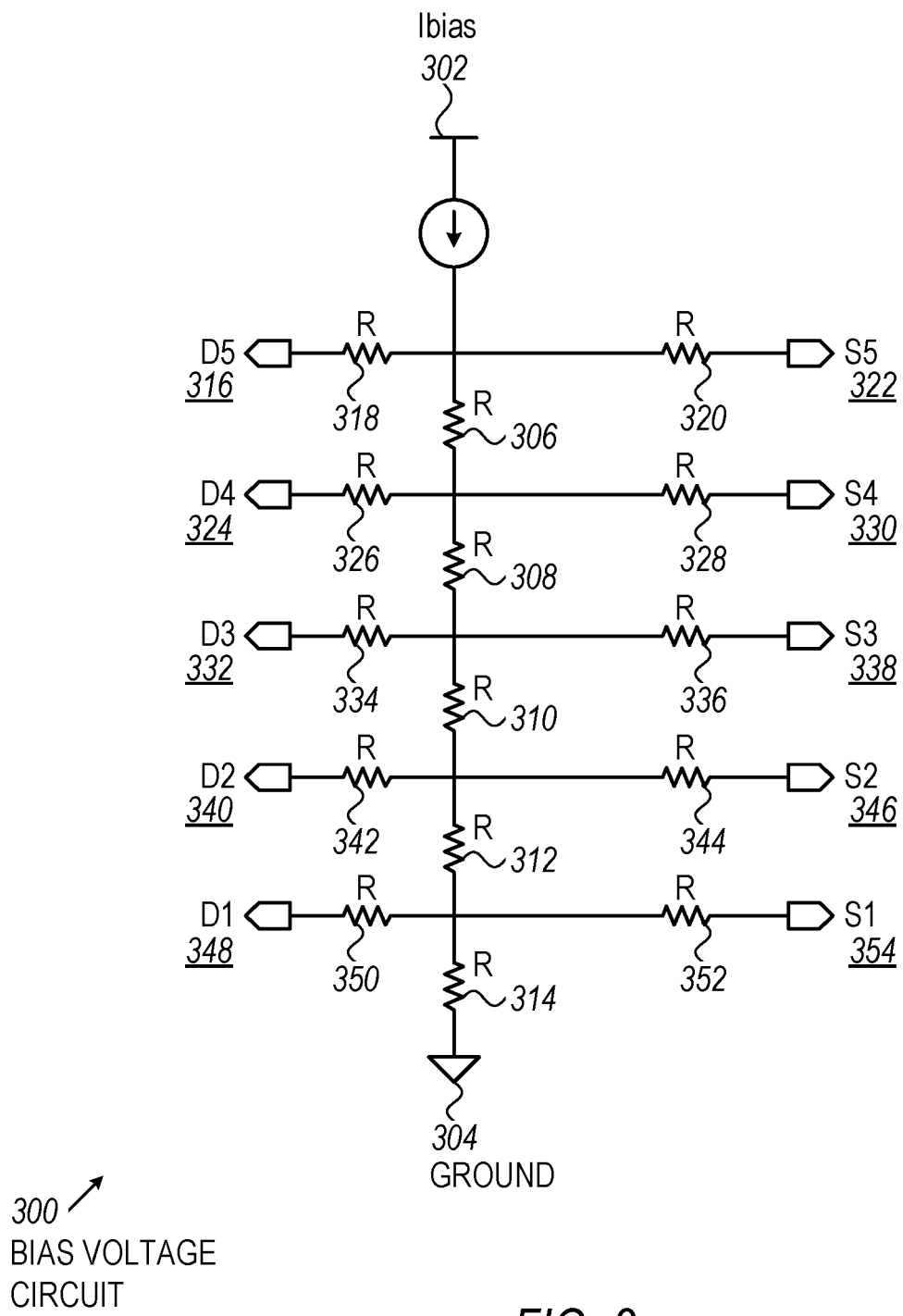
FIG. 3 is a schematic illustration of an embodiment showing a bias voltage network used to offset the voltage controlled capacitor circuits.

FIG. 3 is a schematic diagram showing an embodiment 300 showing a bias voltage circuit. The bias voltage circuit of embodiment 300 may be used with the network of voltage controlled capacitor of embodiment 200 to shift the effective range of each voltage controlled capacitor circuit within embodiment 200.

The bias voltage circuit of embodiment 300 may have an input bias current 302 connected to a ground 304 through a series of resistors 306, 308, 310, 312 and 314. The bias current 302 may connect to the drain D5 316 and source S5 322 through resistors 318 and 320, respectively. After a voltage drop through resistor 306, the circuit may connect to drain D4 324 and source S4 330 through resistors 326 and 328, respectively. After voltage drop through resistors 306 and 308, the circuit may connect to drain D3 332 and source S3 338 through resistors 334 and 336, respectively. Again, after voltage drop through resistors 306, 308, and 310, the circuit may connect to drain D2 340 and source S2 346 through resistors 342 and 344, respectively. Finally, after voltage drop through resistors 306, 308, 310, and 312, and being offset from ground 304 by resistor 314, the circuit connects to drain D1 348 and source S1 354 through resistors 350 and 352, respectively.

The bias voltage circuit of embodiment 300 may shift the effective range of the each of the voltage controlled capacitor circuits of embodiment 200 so that the operating ranges overlap but are spread out over a desired region.

Figure 4:
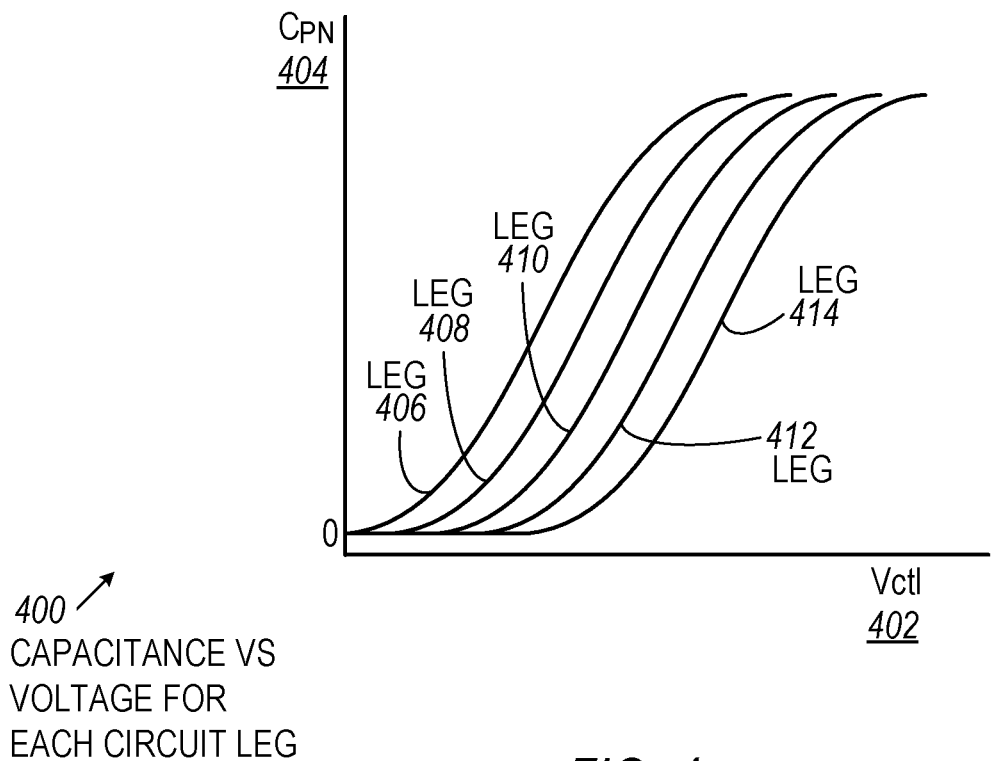
FIG. 4 is a graphical illustration of an embodiment showing a series of capacitance vs voltage for each leg of a voltage controlled capacitor network.

FIG. 4 is a graph illustrating capacitance vs voltage for different legs of the voltage controlled capacitor network of embodiment 200 operated with the bias network of embodiment 300. The horizontal axis is the control voltage Vct1 402 and the vertical axis is the effective capacitance, Cpn 404.

Results may be shown for legs 406, 408, 410, 412, and 414. The legs 406, 408, 410, 412, and 414 may represent the capacitance of the individual voltage controlled capacitor 214, 216, 218, 220, and 222 of embodiment 200, when driven by the bias voltage circuit of embodiment 300.

The distance between the various legs 406, 408, 410, 412, and 414 may be controlled by the difference of the bias voltage between each voltage controlled capacitor. In the example, this would be due to the resistors 306, 308, 310, 312, and 314.

Figure 5:
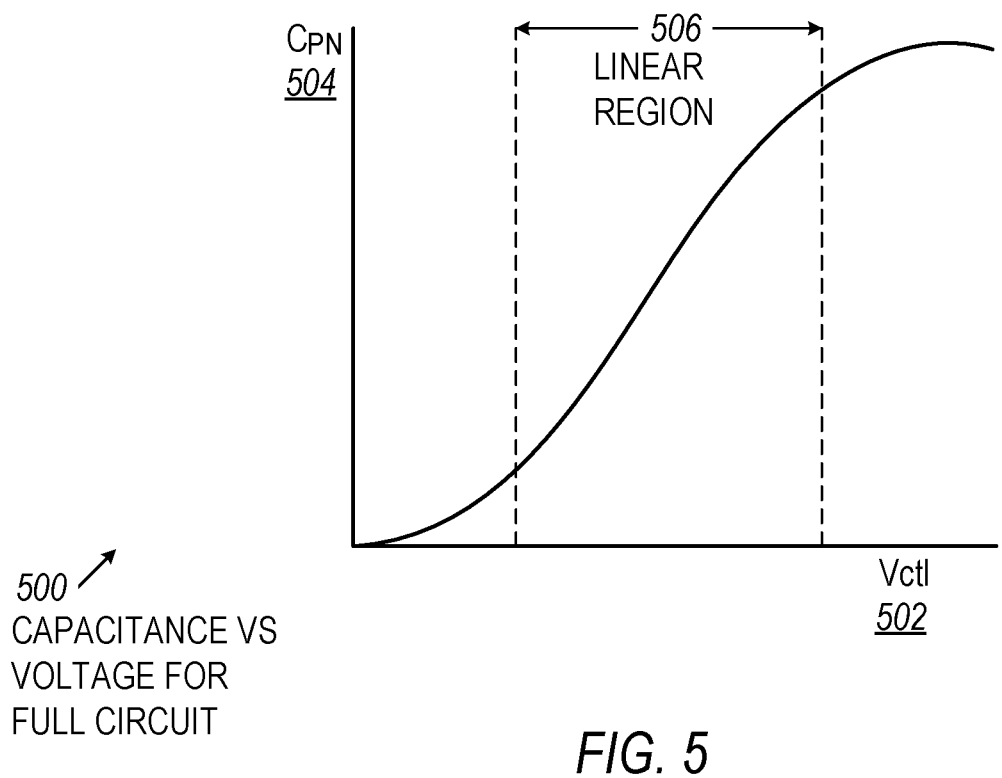
FIG. 5 is a graphical illustration of an embodiment showing a combined output of a network of voltage controlled capacitors.

FIG. 5 is a graph illustrating capacitance vs voltage for the full circuit of embodiment 200 driven by embodiment 300. The voltage Vct1 502 may be illustrated in the horizontal axis while effective capacitance Cpn 504 may be illustrated in the vertical axis. The combined capacitance of the legs illustrated in embodiment 400 may produce an approximate linear region 506 where voltage and capacitance may vary linearly.

The example of embodiments 200, 300, 400, and 500 may illustrate one example of a circuit that approximates a voltage controlled capacitor, where the circuit may be connected in parallel to produce a circuit that may have much larger operating range than the single circuit.

By using the voltage controlled capacitor circuits in parallel and somewhat overlapping the performance bands, a more linear performance may be achieved as a summation of the individuals over the operating range.

Other embodiments may have more or fewer parallel circuits. For the purposes of illustration, the example embodiments have shown five parallel voltage controlled capacitor circuits. However, some embodiments may have as few as two parallel circuits and other embodiments may have 10 or more parallel circuits. Embodiments with more parallel voltage controlled capacitor circuits may have a wider dynamic range or a more linear performance than circuits with fewer parallel voltage controlled capacitor circuits.

By selecting the appropriate resistors in the bias circuit and the capacitors in the voltage controlled capacitor circuit, a complete circuit may be chosen that provides a desired dynamic range and linearity.

Figure 6:
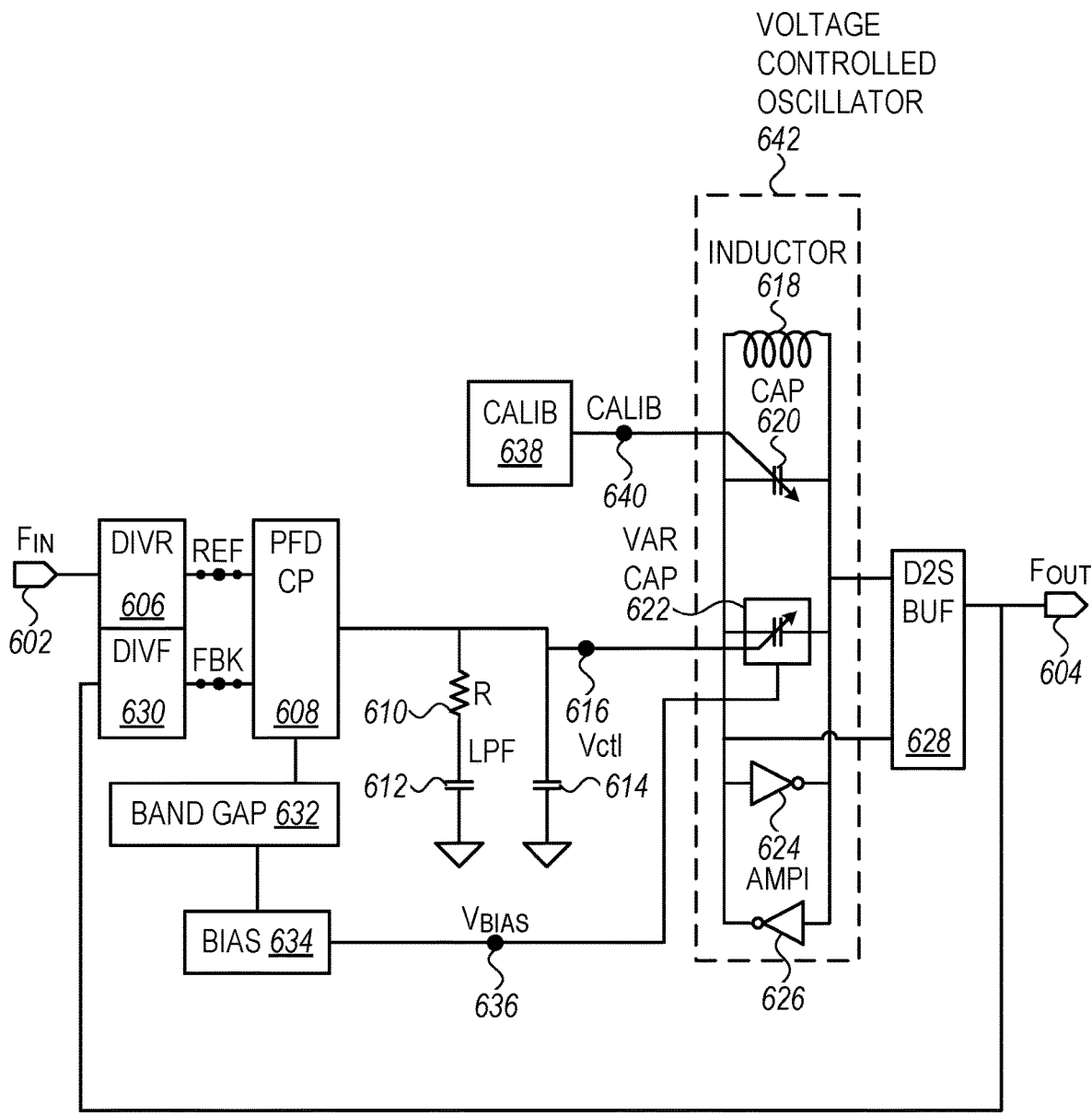
FIG. 6 is a schematic illustration of an embodiment showing a phase locked loop using a voltage controlled capacitor.

FIG. 6 is a schematic illustration of an embodiment 600 showing a phase locked loop circuit using a voltage controlled capacitor circuit, such as one from embodiments 200 and 300.

An input frequency Fin 602 and output frequency Fout 604 are shown. The phase locked loop circuit of embodiment 600 may match the output frequency Fout 604 to the input frequency Fin 602. In some use cases, the output frequency Fout 604 may be a multiple of the input frequency Fin 602, while other use cases may configure the input frequency Fin 602 to be a multiple of the output frequency Fout 604. Phase locked loop circuits have many uses within analog and digital circuitry.

Fin 602 is connected to a frequency divider 606 to produce a reference signal for a phase and frequency detector and charge pump 608. The phase and frequency detector compares the reference signal from the frequency divider 606 with an oscillator generated feedback signal from a frequency divider 630.

A charge pump in the phase and frequency detector 608 converts the phase error signals between REF and FBK into current pulses proportional to the phase error signals. The current pulses go through a low pass filter comprised of a resistor 610 and capacitors 612 and 614 to produce a Vctl signal 616.

The Vctl signal 616 is the input to a variable capacitor 622, which may be similar to the circuits of embodiments 200 and 300, discussed above.

The switched set of capacitors 620 may be an array of fixed value capacitors that may be switched in or out of the circuit. A calibration circuit 638 may select the appropriate capacitance during a setup procedure, then send a calibration signal 640 to the switched set of capacitors 620 to select the appropriate capacitors.

A voltage controlled oscillator 642 may comprise an inductor 618 connected in parallel to a switched set of capacitors 620, the voltage controlled variable capacitor 622, and amplifiers 624 and 626.

Signals from a bandgap circuit 632 may be sent to a charge pump circuit 608 and to a bias circuit 634 to produce a bias signal 636. The bias signal 636 may set the bias of the variable capacitor 622.

The complementary oscillation signals of the voltage controlled oscillator 642 may be converted to a rail-to-rail square wave signal by the differential to a single ended converter, then buffered in circuit 628 to produce Fout 604.

The signal Fout 604 is fed back to the divider 630.

The resistor 610 in the low pass filter may be constructed of identical materials as resistors used in the bandgap 632. The operation of the bandgap circuit 632 is well known. It produces a current within which when driven into a resistor produces a voltage which is mostly constant over process, voltage and temperature variations. As the magnitude of charge pump current 608 is derived from the bandgap 632, and the loop filter resistor 610 is constructed of the same materials used in the bandgap 632, the product of Icp*Rz is held constant and is independent of process, temperature and voltage. Because the sensitivity of change in voltage of the variable capacitor circuit, Kvco, may be constant over its operating range, due to the bias voltages 636 being derived from a bandgap 632, the product of Icp*Rx*Kvco may be constant. This property results in the phase locked loop bandwidth being constrained.

Figure 7:
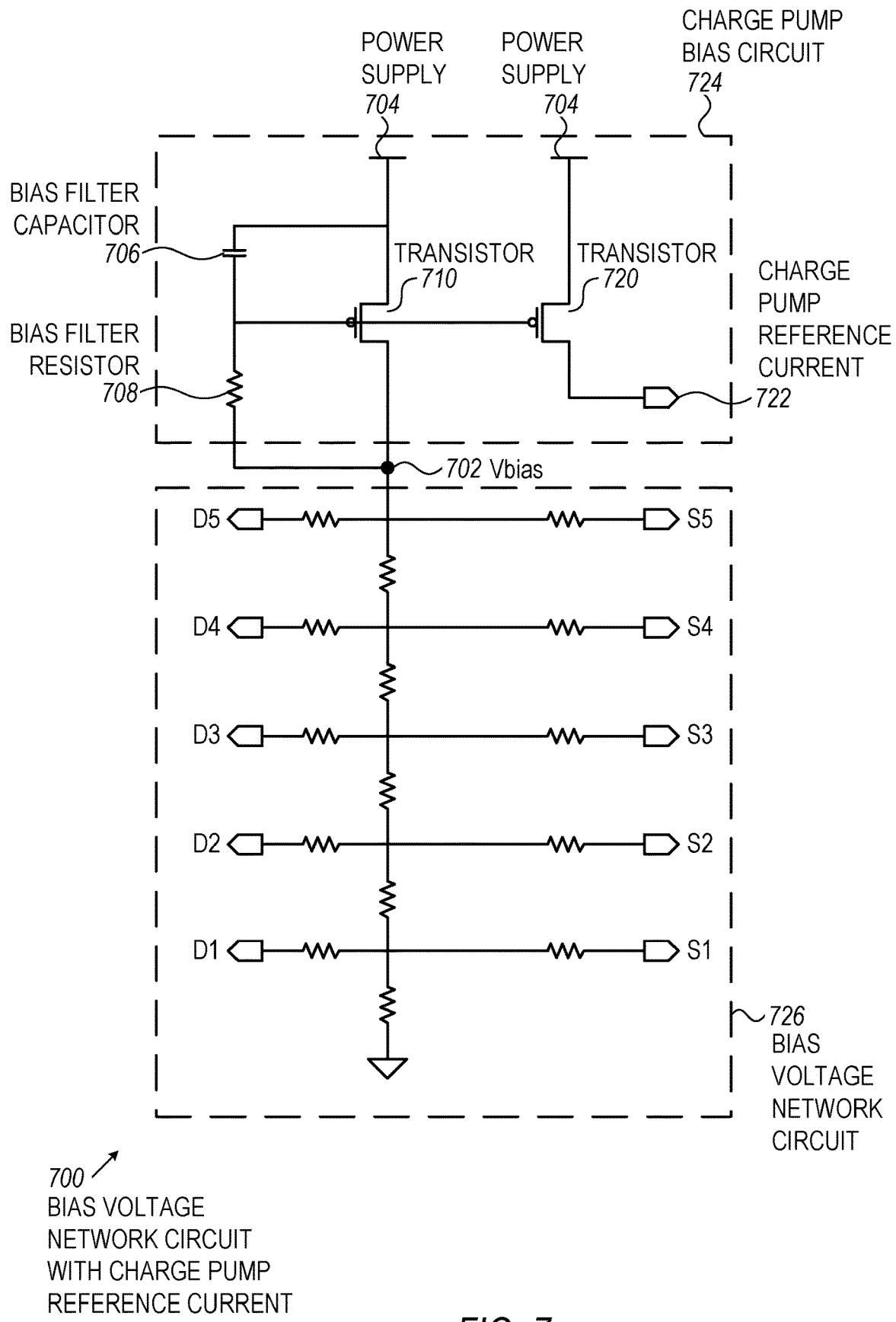
FIG. 7 is a schematic illustration of an embodiment showing a bias voltage network circuit with a charge pump reference circuit.

FIG. 7 illustrates an embodiment 700 showing a bias voltage network circuit 726 with a charge pump bias circuit 724. Embodiment 700 may be a modification to the phase locked loop circuit of embodiment 600 where the bandgap circuitry may be removed.

A power supply 704 may be connected to a low pass filter comprising a bias filter capacitor 706, which connects to the gate of a transistor 710. The gate may also be connected to a bias filter resistor 708 and the drain of the transistor 710 to create the bias current at node 702.

A charge pump reference current 722 may be a the drain of a second transistor 720, whose source is connected to a power supply 704 and whose the gate is connected to the gate of transistor 710.

The bias voltage network circuit 726 may be identical to the network of embodiment 300 illustrated above. The resistors comprising bias voltage network 726 may be constructed out of identical elements as the loop filter resistor 610 of 600 or 810 of 800 such that if one set of resistors vary with process or temperature, the other set of resistors vary proportionately.

Embodiment 700 may illustrate a circuit where the bias voltages D1-D5 and S1-S5 vary in proportion to charge pump reference current 722. Increase of power supply 704 would result in increase of bias voltage range which in turn reduces the sensitivity of the VCO. The product of sensitivity of VCO and the charge pump current might be held constant.

Alternatively, increase of value of resistance in resistors of bias network 726 due to process or temperature may result in a reduction in charge pump reference current 722 while not affecting bias voltages D1-D5 and S1-S2. However, the value of identically constructed resistor in the loop filter 610 of 600 or 810 of 800 would vary proportionately. The product of the charge pump current and loop filter resistance may be held constant.

The product of VCO sensitivity times charge pump current times loop filter resistance being held constant may exhibit tolerance to, and little interference from, process, voltage, and temperature variations, thereby replacing a bandgap circuit.

Bandgap circuits may be expensive to produce and may be notoriously complex. Bandgap circuits are designed to provide a clean, stable reference voltage over a wide range of temperature variations, a wide range of process variations, and a wide range of input voltages.

The charge pump bias circuit 724 uses a low pass filter to remove high frequency noise from the power supply. Merely by filtering this noise, the overall performance of a phase locked loop circuit may be improved.

Figure 8:
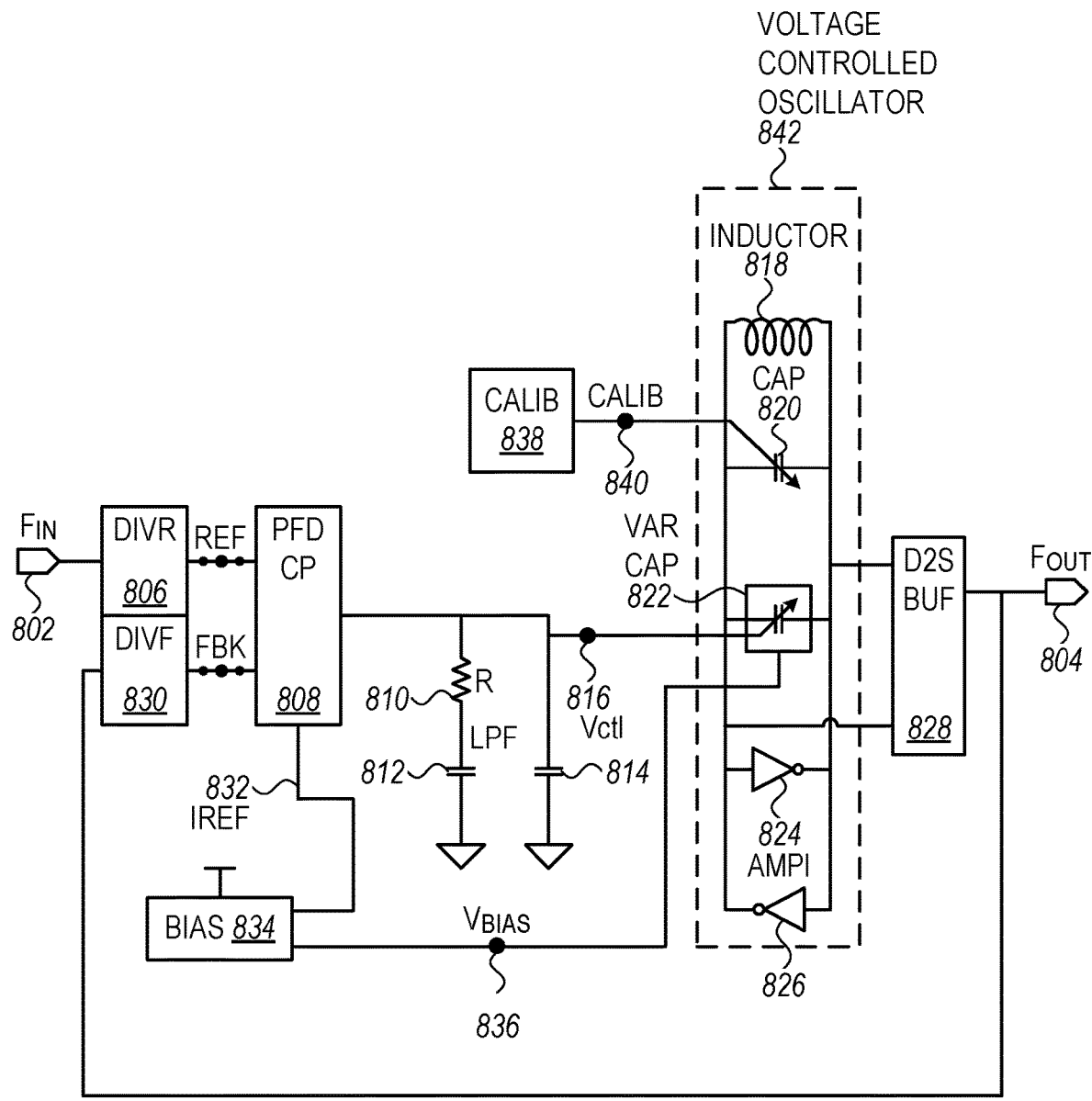
FIG. 8 is a schematic illustration of an embodiment showing a phase locked loop circuit using a voltage controlled capacitor and a charge pump reference circuit.

FIG. 8 is a schematic illustration of an embodiment 800 showing a phase locked loop circuit where the bandgap circuitry may be removed. The bandgap circuitry may be replaced with the charge pump bias circuit 700.

An input frequency Fin 802 and output frequency Fout 804 are shown. The phase locked loop circuit of embodiment 800 may match the output frequency Fout 804 to the input frequency Fin 802. In some use cases, the output frequency Fout 804 may be a multiple of the input frequency Fin 802, while other use cases may configure the input frequency Fin 802 to be a multiple of the output frequency Fout 804. Phase locked loop circuits have many uses within analog and digital circuitry.

Fin 802 is connected to a frequency divider 806 to produce a reference signal for a phase and frequency detector and charge pump 808. The phase and frequency detector compares the reference signal from the frequency divider 806 with an oscillator generated feedback signal from a frequency divider 830.

A charge pump in the phase and frequency detector 808 converts the phase error signals between REF and FBK into current pulses proportional to the error signals. The current pulses go through a low pass filter comprised of a resistor 810 and capacitors 812 and 814 to produce a Vctl signal 816.

The Vctl signal 816 is the input to a variable capacitor 822, which may be similar to the circuits of embodiments 200 and 300, discussed above.

The switched set of capacitors 820 may be an array of fixed value capacitors that may be switched in or out of the circuit. A calibration circuit 838 may select the appropriate capacitance during a setup procedure, then send a calibration signal 840 to the switched set of capacitors 820 to select the appropriate capacitors.

A voltage controlled oscillator 842 may comprise an inductor 818 connected in parallel to a switched set of capacitors 820, the voltage controlled variable capacitor 822, and amplifiers 824 and 826.

The bias circuit 834 generates a signal 832 which may be sent to the a charge pump 808, and Vbias signal 836. Vbias signal 836 may adjust the bias of the variable capacitor 822.

The complementary oscillation signals of the voltage controlled oscillator 838 may be converted to a rail-to-rail square wave signal by a differential to a single ended converter, then buffered in circuit 828 to produce Fout 804.

The signal Fout 804 is fed back to the divider 830.

The phase locked loop circuit of embodiment 800 may be immune, or at least less sensitive, to process, voltage, and temperature variations as an inherent property of the phase locked loop.

The sensitivity to a change in frequency to the change in voltage of a variable capacitor circuit may be represented as Kvco. Using Icp as the current pulse magnitude and Rz as the resistance of resistor 610, the loop bandwidth of the phase locked loop circuit of embodiment 600 may be proportional to Icp*Rx*Kvco.

Figure 9:
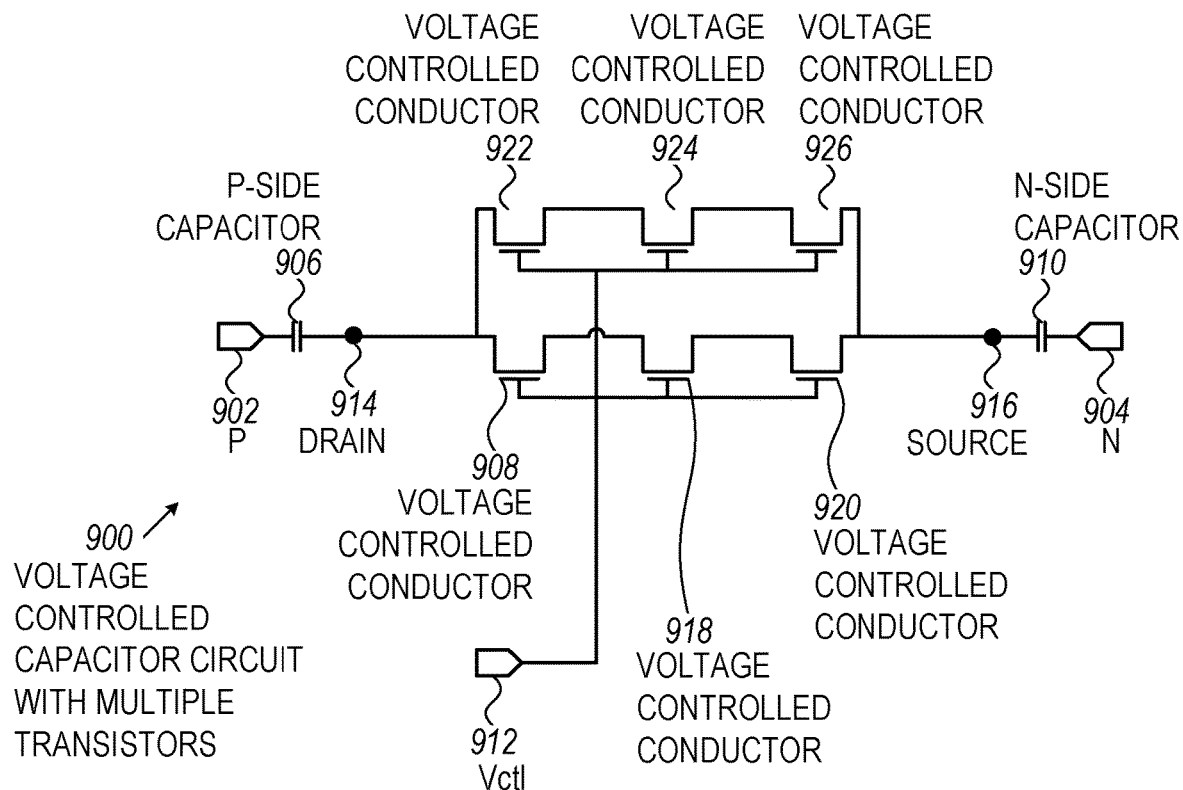
FIG. 9 is a schematic illustration of an embodiment showing a voltage controlled capacitor circuit with multiple transistors.

FIG. 9 is a schematic diagram showing an embodiment 900 of a voltage controlled capacitor circuit having multiple transistors.

The voltage controlled capacitor circuit may be part of a voltage controlled oscillator circuit. Embodiment 900 is a circuit showing connections P 902 and N 904, having a P-side capacitor 906, a first voltage controlled conductor 908, second and third voltage controlled conductors 918 and 920, and an N-side capacitor 910 connected in series.

In parallel with the first set of transistors are connected transistors 922, 924, and 926.

A Vctl 912 signal is attached to the gate of each of the transistors 908, 918, 920, 922, 924, and 926, thereby controlling the capacitance seen by an oscillator.

Embodiment 900 may act in a similar manner as embodiment 100 above, where input P 902 and output N 904 are sine wave or other periodic waveforms.

Embodiment 900 is an example where multiple transistors may be used in place of a single transistor as in embodiment 100. One reason for using multiple transistors in place of a single transistor is to reduce noise caused when a single transistor may be operated on or near its threshold voltage.

The term "voltage controlled conductor" is used as a generic term to represent any type of transistor or other device that may change conductance, such as resistance or capacitance, based on an input signal.

As in embodiment 100, resistance between the drain 914 and source 916 may be represented by Rds. Rds may be high when Vctl 912 is below the threshold voltage of the device, and Rds may be low when Vctl 912 is above the threshold voltage of the device.

The capacitance across nodes P 902 and N 904 may be represented by Cpn. As Vctl 912 moves higher, the effective Cpn moves higher as well.

The example of embodiment 900 illustrates that when more than one transistor or other voltage controlled conductors may be used in a voltage controlled capacitor, the voltage controlled conductors may be arranged in serial, parallel, or in networks of both serial and parallel devices.

Figure 10:
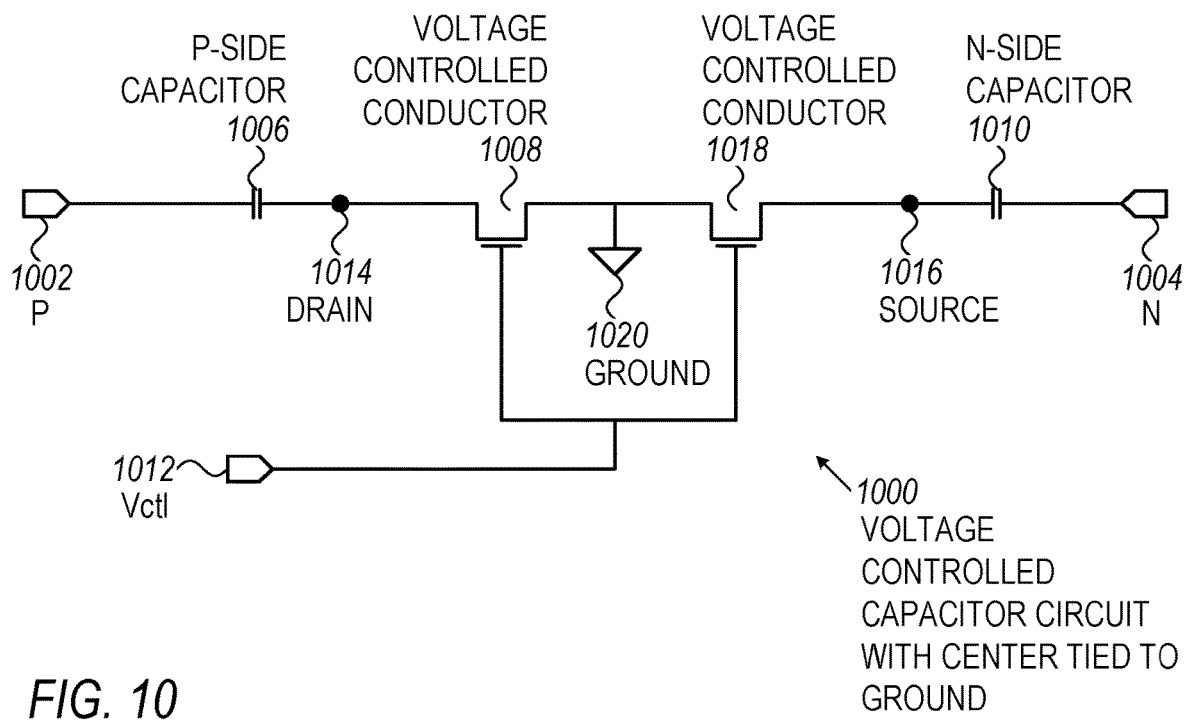
FIG. 10 is a schematic illustration of an embodiment showing a voltage controlled capacitor circuit with center tied to ground.

FIG. 10 is a schematic diagram showing an embodiment 1000 of a voltage controlled capacitor circuit having two transistors that share a common tie to ground.

Embodiment 1000 is a circuit showing connections P 1002 and N 1004, having a P-side capacitor 1006, a first transistor or voltage controlled conductor 1008, a connection to ground 1020, a second voltage controlled conductor 1018, and an N-side capacitor 1010 connected in series. A Vctl 1012 signal is attached to the gates of the voltage controlled conductors 1008 and 1018, thereby controlling the capacitance seen by an oscillator. The GND 1020 may be the actual system ground, or may comprise a signal ground with a DC bias included.

Like other embodiments, embodiment 1000 may act as a variable capacitor when input P 1002 and output N 1004 are sine wave or other periodic waveforms.

Figure 11:
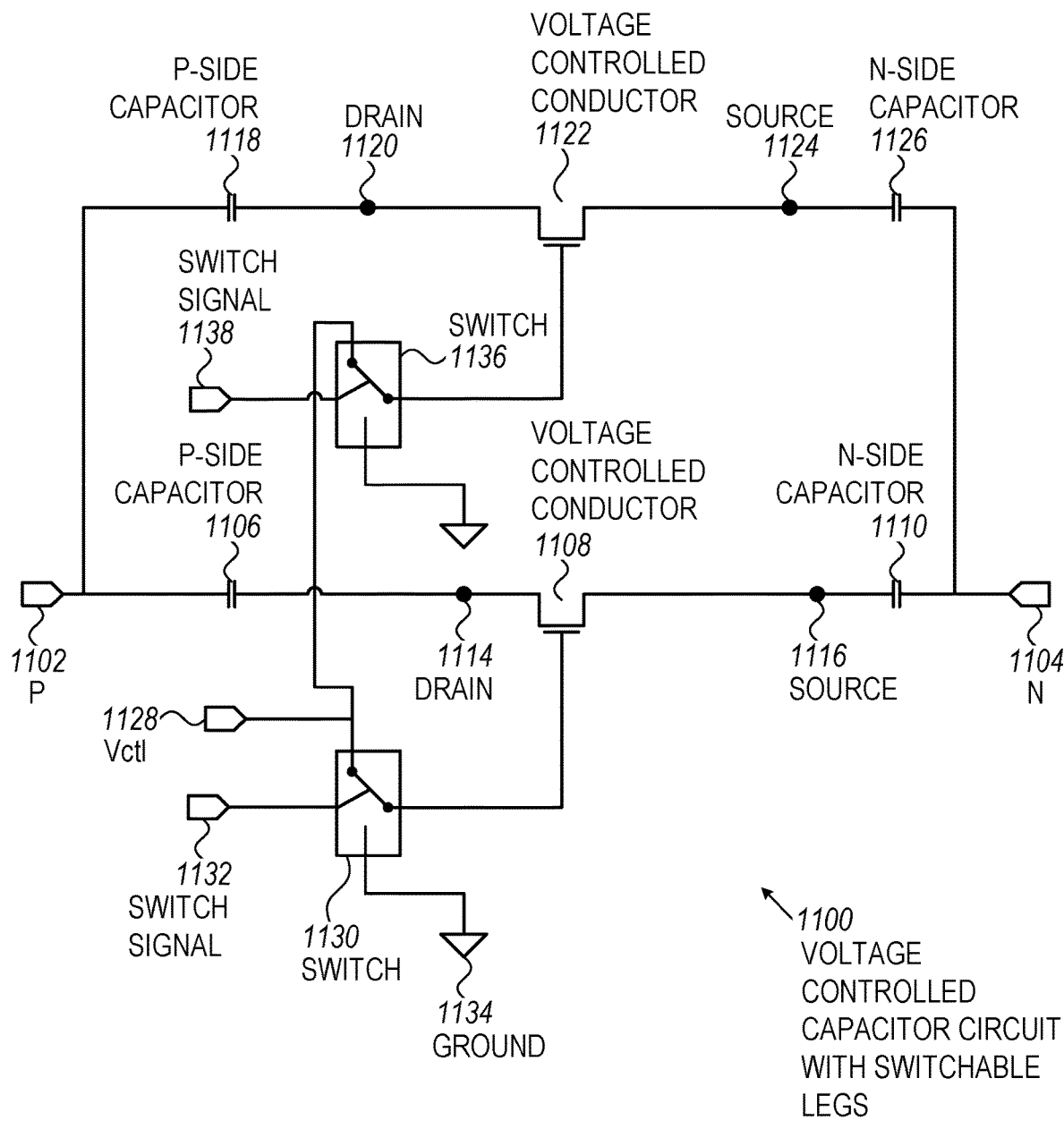
FIG. 11 is a schematic illustration of an embodiment showing a circuit with parallel voltage controlled capacitor circuits, where each circuit may be switched in and out.

FIG. 11 is a schematic diagram showing an embodiment 1100 of a voltage controlled capacitor circuit showing a version with two switchable legs.

The voltage controlled capacitor circuit may be part of a voltage controlled oscillator circuit. Embodiment 1100 is a circuit showing connections P 1102 and N 1104, having a P-side capacitor 1106, a transistor 1108, and an N-side capacitor 1110 connected in series.

In parallel and connected to node P 1102 and node N 1104 are a second P-side capacitor 1118, drain 1120, a voltage controlled conductor 1122, source 1124, and a second N-side capacitor 1126.

A Vctl 1128 signal is attached to a switch 1130, which may be controlled by a switch signal 1132. The Vctl 1128 signal may be routed to the gate of transistor 1108, and may be switched into and out of the circuit to the gate of transistor 1122.

Similarly, a switch 1136 may be controlled by a second switch signal 1138. Switch 1136 may allow the voltage controlled conductor 1122 to be controlled by the Vctl 1128 signal or be pushed to ground.

Embodiment 1100 may act as a variable capacitor when input P 1102 and output N 1104 are sine wave or other periodic waveforms.

Embodiment 1100 may be one example of a variable capacitance network where one or more legs may be switched into and out of the network. The two switches 1130 and 1136 allow one or both of the two varactor circuits to be switched into or out of the overall circuit.

Figure 12:
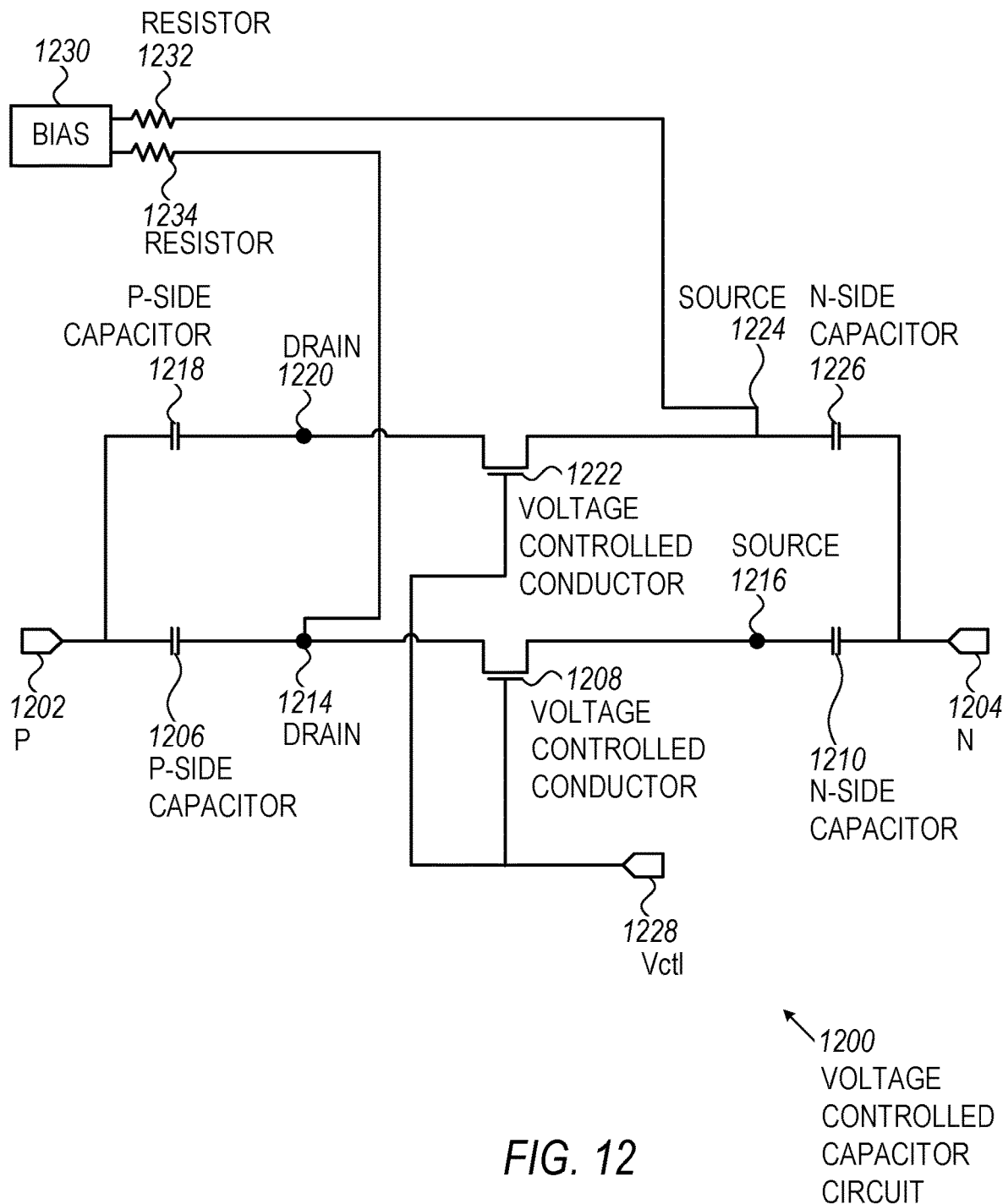
FIG. 12 is a schematic illustration of an embodiment showing a voltage controlled capacitor with parallel circuits, where each circuit may have a bias voltage applied.

FIG. 12 is a schematic diagram showing an embodiment 1200 of a voltage controlled capacitor circuit showing a version with alternative connections for bias voltages.

The voltage controlled capacitor circuit may be part of a voltage controlled oscillator circuit. Embodiment 1200 is a circuit showing connections P 1202 and N 1204, having a P-side capacitor 1206, a transistor 1208, and an N-side capacitor 1210 connected in series.

In parallel and connected to node P 1202 and node N 1204 are a second P-side capacitor 1218, drain 1220, a voltage controlled conductor 1222, source 1224, and a second N-side capacitor 1226.

A Vctl 1228 signal is attached to the gates for transistors 1208 and 1222.

The bias voltage source 1230 may have two outputs. The first output may pass through resistor 1232 and connect to source 1224. A second output may pass through resistor 1234 and connect to drain 1214.

Embodiment 1200 may act as a variable capacitor when input P 1202 and output N 1204 are sine wave or other periodic waveforms.

Embodiment 1200 may be one example of a variable capacitance network where the bias voltages may be applied to one or more of the source or drain nodes of a variable capacitance circuit. In other embodiments, such as embodiment 100 and 200, a bias voltage source may be applied to both the source and drain nodes of each leg of a voltage controlled capacitance network. In the example of embodiment 1200, one leg is connected with a first bias voltage to a source node of a first circuit and a second node is connected with a second bias voltage to a drain of a second circuit.

Figure 13A:
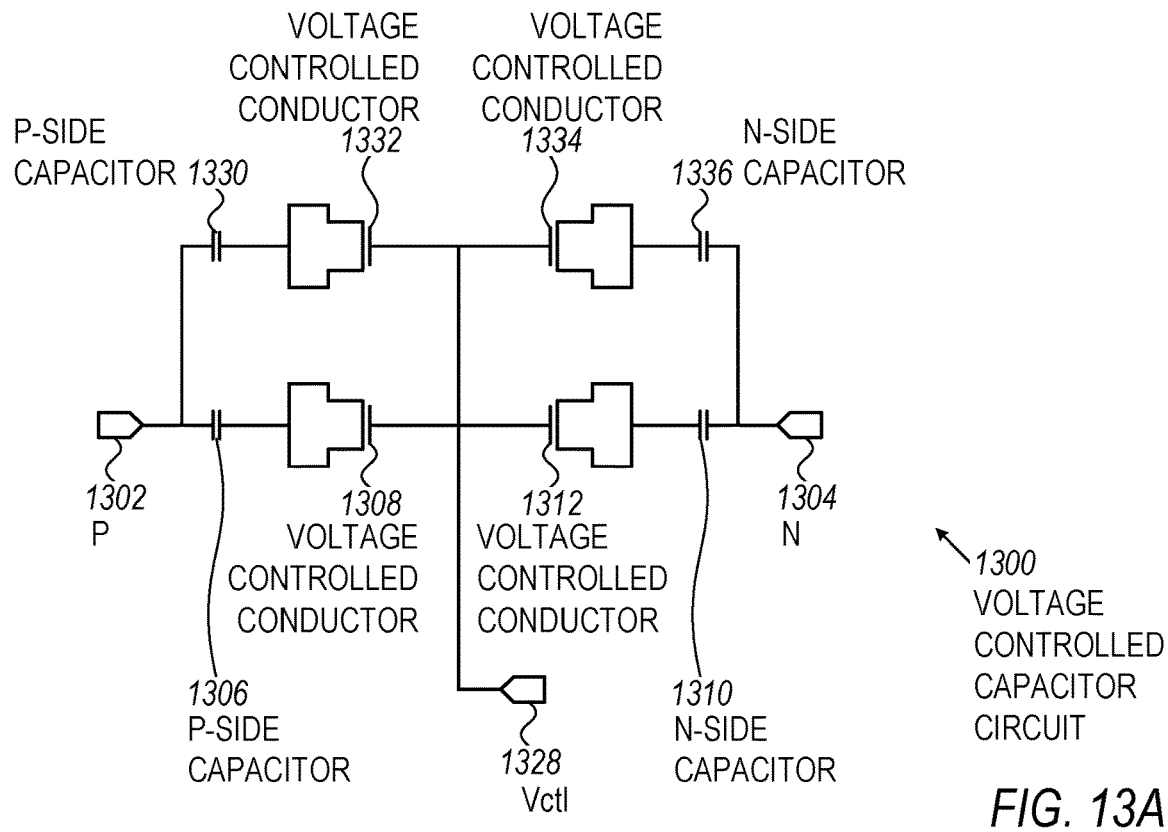
FIG. 13A is a schematic illustration of an embodiment showing a voltage controlled capacitor using the parasitic capacitance of voltage controlled conductors.

FIG. 13A is a schematic diagram showing an embodiment 1300 of a voltage controlled capacitor circuit. Embodiment 1300 illustrates a version of a voltage controlled capacitor circuit where the parasitic capacitance of common voltage controlled conductors may be employed to adjust the capacitance of the circuit.

Embodiment 1300 is a circuit showing connections P 1302 and N 1304. A first circuit may have a P-side capacitor 1306 and a first voltage controlled conductor 1308, a second voltage controlled conductor 1312, and an N-side capacitor 1310 connected to the N node 1304.

A second circuit may be connected to the P node 1302 and have a P-side capacitor 1330, a third voltage controlled conductor 1332, a second voltage controlled conductor 1334, and an N-side capacitor 1336 connected to the N node 1304.

The voltage controlled conductors 1308 and 1332 are arranged with their source and drain connections tied to the respective P-side capacitors 1306 and 1330. Similarly, the voltage controlled conductors 1312 and 1334 are arranged with their source and drain connections tied to the respective N-side conductors 1310 and 1336. The gates of all the voltage controlled capacitors 1308, 1312, 1332, and 1334 are connected to Vctl 1328, the control voltage. The VCTL 1328 may comprise a DC bias voltage, or may comprise a high frequency signal ground with a DC bias included.

Bias voltages may be applied to the source and drain connections. It is to be noted that shorted source and drain connections of each of the voltage controlled conductors 1308, 1328, 1332 and 1334 are capacitively isolated, or in other words DC blocked from nodes P 1302 N 1304 and VCTL 1328. The bias voltages applied at each of the shorted source and drain nodes might be different, chosen to provide a desired capacitance vs voltage performance.

Embodiment 1300 is one example of how the parasitic capacitance found in all voltage controlled conductors, such as transistors, can be harnessed to vary the capacitance of a voltage controlled capacitance circuit.

Figure 13B:
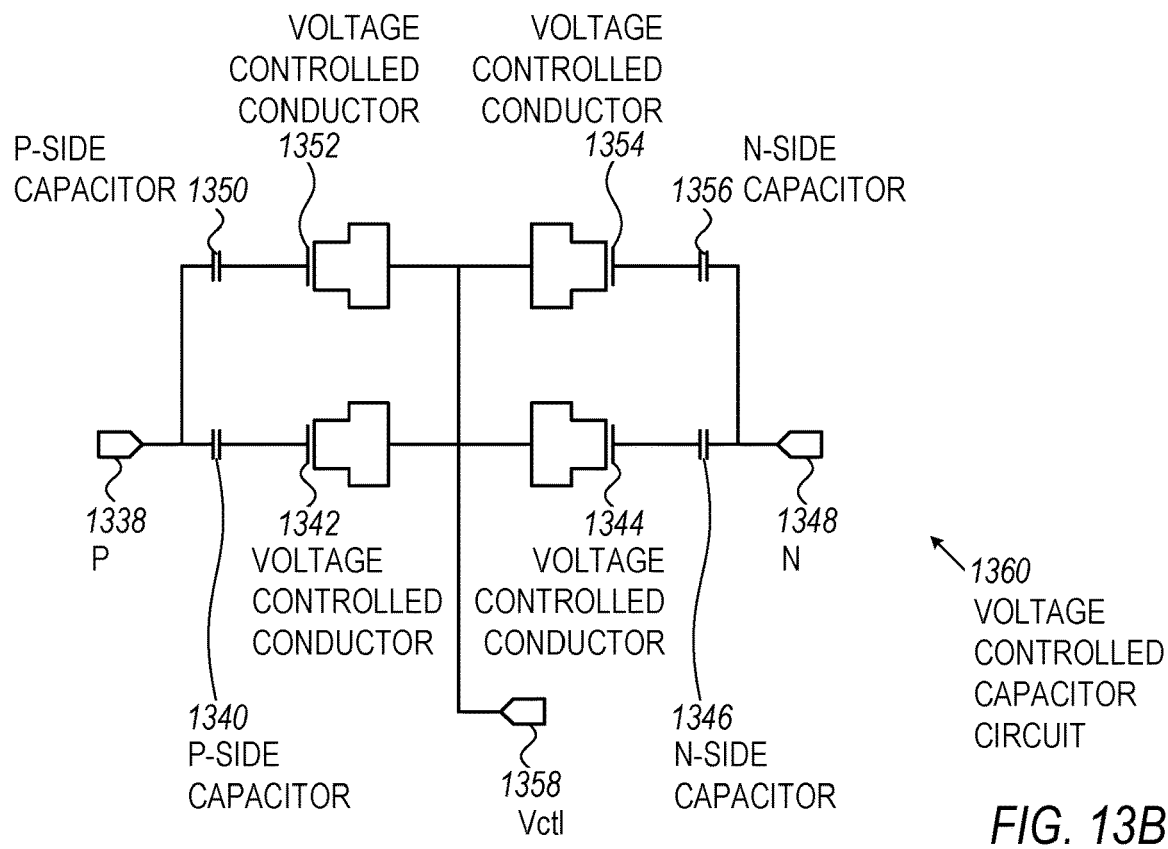
FIG. 13B is a schematic illustration of an embodiment showing a second voltage controlled capacitor using the parasitic capacitance of voltage controlled conductors

FIG. 13B is a schematic diagram showing an embodiment 1360 of a voltage controlled capacitor circuit. Embodiment 1360 is similar to embodiment 1300, but the voltage controlled conductors are wired in an opposite manner.

Both embodiments 1300 and 1360 illustrate circuits where the inherent capacitance of voltage controlled conductors may be put to use. In many cases, the capacitance of a transistor or other voltage controlled device may be an unwelcome component in circuit design. However, the embodiments illustrate how those unwanted components may be exploited.

Embodiment 1360 illustrates a circuit with two parallel voltage controlled capacitor circuits, the first one beginning with a P node 1338 connected to a P-side capacitor 1340 and a voltage controlled conductor 1342. A second voltage controlled conductor 1344 may be connected to an N-side capacitor 1346 which is connected to the N node 1348.

A second circuit may be connected to the P node 1338 and have a P-side capacitor 1350, a first voltage controlled conductor 1352, a second voltage controlled conductor 1354, and an N-side capacitor 1356 connected to the N node 1348.

In this embodiment, the voltage controlled conductors 1342 and 1352 have their gates connected to the respective P-side capacitors 1342 and 1352. Similarly, the gates of voltage controlled conductors 1344 and 1354 have their gates connected to the respective N-side capacitors 1346 and 1356.

The source and drains of the voltage controlled conductors 1342, 1344, 1352, and 1354 are all tied to the voltage control input Vctl 1358.

Embodiment 1360 applies a control voltage to the source and drains of the voltage controlled conductors, where embodiment 1300 applies a control voltage to the gates of the voltage controlled conductors. In both cases, the embodiments 1300 and 1360 may act as a variable capacitor when input P and output N are sine wave or other periodic waveforms. In most cases, an inductor (not shown) may be present across the P and N nodes.

Because the input and output are periodic waveforms, the voltage at the center of the circuits may be zero. Because of this fact, both legs of the embodiments 1300 and 1360 may be open at the center of the circuit, where the control voltage Vctl 1328 or 1358 may be applied, and no conductors may connect the P-side and N-side of the circuit.

The foregoing description of the subject matter has been presented for purposes of illustration and description. It is not intended to be exhaustive or to limit the subject matter to the precise form disclosed, and other modifications and variations may be possible in light of the above teachings. The embodiments were chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments except insofar as limited by the prior art.

The invention claimed is:

1. A variable capacitance circuit comprising:
a varactor circuit comprising:
a first node, a second node, a third node, and a fourth node;
a first Voltage Controlled Conductor (VCC) device having a first conducting node connected to said first node and a second conducting node connected to said second node;
a first capacitor having a first terminal connected to said first node and a second terminal connected to said third node;
a second capacitor having a first terminal connected to said second node and a second terminal connected to said fourth node; and
a control voltage input connected to a control node of said first VCC device, said control voltage input being an analog voltage input.

2. The variable capacitance circuit of claim 1, said first Voltage Controlled Conductor (VCC) comprising a Metal Oxide Semiconductor (MOS) device.

3. The variable capacitance circuit of claim 1, said first VCC being wired to create a conducting path between said first capacitor and said second capacitor.

4. The variable capacitance circuit of claim 1, comprising a plurality of VCC devices.

5. The variable capacitance circuit of claim 4, said plurality of VCC devices being wired to create a conducting path between said first capacitor and said second capacitor to a signal ground.

6. The variable capacitance circuit of claim 4, further comprising:
for each of said plurality of VCC devices, a conductive path between said first conducting node and said second conducting node.

7. The variable capacitance circuit of claim 6, further comprising:
a plurality of varactor circuits, each of said varactor circuits connecting to said third node and said fourth node, said plurality of varactor circuits being in parallel with each other.

8. The variable capacitance circuit of claim 7, further comprising:
a first bias voltage applied to a-said second node of a first varactor circuit; and
a second bias voltage applied to said second node of a second varactor circuit, said first varactor circuit and said second varactor circuit being part of said plurality of said varactor circuits.

9. The variable capacitance circuit of claim 7, further comprising:
a first bias voltage applied to a-said first node of a first varactor circuit; and
a second bias voltage applied to said first node of a second varactor circuit, said first varactor circuit and said second varactor circuit being part of said plurality of said varactor circuits.

10. The variable capacitance circuit of claim 1, further comprising:
a plurality of said varactor circuits, each of said varactor circuits connecting to said third node and said fourth node, said plurality of varactor circuits being in parallel with each other.

11. The variable capacitance circuit of claim 10, further comprising:
a first switch between a control voltage input of first and second varactor circuits, said first and second varactor circuits being part of said plurality of varactor circuits;
said first switch configured such that, in a first position, said first and second varactor circuits are driven by said control voltage input;
said first switch configured such that, in a second position, said first varactor circuit is driven by said control voltage input and said second varactor circuit is not driven by said control voltage input.

12. The variable capacitance circuit of claim 11, further comprising:
a second switch between said control voltage input of said first and second varactor circuits;
said second switch configured such that, in a first position, said first and second varactor circuits are driven by said control voltage input;
said second switch configured such that, in a second position, said second varactor circuit is driven by said control voltage input and said first varactor circuit is not driven by said control voltage input.

13. The variable capacitance circuit of claim 10, further comprising:
a network of switchable capacitors, at least one of said switchable capacitors being switched into said variable capacitance circuit.

14. The variable capacitance circuit of claim 13, further comprising:
a calibration engine configured to switch in or out at least one of said switchable capacitors from said network of switchable capacitors.

15. The variable capacitance circuit of claim 1, further comprising:
a bias voltage circuit comprising a direct current bias voltage source connected to said first node of said first varactor circuit.

16. The variable capacitance circuit of claim 1, further comprising:
a bias voltage circuit comprising a direct current bias voltage source connected to said second node of said varactor circuit.

17. The variable capacitance circuit of claim 16, said bias voltage circuit comprising a second direct current bias voltage source being connected to said first node of said varactor circuit.

18. The variable capacitance circuit of claim 17, where all of said capacitors are of the same type.

19. The variable capacitance circuit of claim 1, said first VCC device being an N-type device.

20. The variable capacitance circuit of claim 1, said first VCC device being a P-type device.

21. A phase locked loop (PLL) circuit comprising:
a plurality of variable capacitance circuits, each of said variable capacitance circuits comprising:
a first node, a second node, a third node, and a fourth node;
a first Voltage Controlled Conductor (VCC) device having a first conducting node connected to said first node and a second conducting node connected to said second node;
a first capacitor having a first terminal connected to said first conducting node and a second terminal connected to said third conducting node;

a second capacitor having a first terminal connected to said second conducting node and a second terminal connected to said fourth conducting node; and a control voltage input connected to a control node of said first VCC device, said control voltage input being an analog voltage input;

said plurality of variable capacitance circuits being connected in parallel at said third conducting nodes and said fourth conducting nodes; and a bias voltage generator circuit providing a different bias voltage to each of said variable capacitance circuits to at least one of said first conducting node and said second conducting node.

22. The phase locked loop circuit of claim 21, further comprising:

a network of switchable capacitors, connected between said third conducting node and said fourth conducting node, at least one of said switchable capacitors being switched into said variable capacitance circuit.

23. The phase locked loop circuit of claim 22, further comprising:

a calibration engine configured to switch in or out at least one of said switchable capacitors from said network of switchable capacitors.

24. The phase locked loop circuit of claim 23, further comprising:

a charge pump current reference circuit comprising:
a power supply input;
a first charge pump device;
a first filter capacitor filter connected to said power supply input and a gate for said first charge pump device;
a first filter resistor connected between said gate for said first charge pump device and said bias voltage circuit;
a second charge pump device having a source connected to said power supply input, a gate connected to said gate of said first charge pump device, and a drain connected to a charge pump reference circuit.

25. The phase locked loop circuit of claim 24, not comprising a bandgap circuit.

26. The phase locked loop circuit of claim 25, wherein all of said capacitors are of the same type.

* * * * *